United States Patent
Hartemann

Patent Number: 5,307,068
Date of Patent: Apr. 26, 1994

[54] TUNABLE HIGH-FREQUENCY DEVICES

[75] Inventor: Pierre Hartemann, Paris, France

[73] Assignee: Thomson-CSF, Puteaux, France

[21] Appl. No.: 704,936

[22] Filed: May 23, 1991

[30] Foreign Application Priority Data

Jun. 1, 1990 [FR] France .................. 90 06877

[51] Int. Cl.$^5$ .................................. H01Q 17/00
[52] U.S. Cl. .................................. 342/1; 342/4; 342/5; 342/6; 342/13; 342/187; 342/188; 505/702; 505/851
[58] Field of Search ............... 342/1, 2, 4, 5, 6, 13, 342/187, 188; 505/701, 815, 851, 872, 702, 828, 853

[56] References Cited

U.S. PATENT DOCUMENTS

| | | | |
|---|---|---|---|
| H693 | 10/1989 | Leupold | 335/216 |
| 4,349,796 | 9/1982 | Chin et al. | 333/186 |
| 4,456,912 | 6/1984 | Ensley | . |
| 4,905,319 | 2/1990 | Schroder et al. | 357/65 |
| 4,962,316 | 10/1990 | Jack | 250/336.2 |
| 4,970,395 | 11/1990 | Kruse, Jr. | 250/336.2 |
| 4,978,853 | 12/1990 | Hilal | 505/849 X |
| 4,989,006 | 1/1991 | Roth | 342/1 |
| 5,011,818 | 4/1991 | Katoka et al. | 324/248 |
| 5,012,302 | 4/1991 | Goronkin | 357/4 |
| 5,036,042 | 7/1991 | Hed | 505/1 |
| 5,055,785 | 10/1991 | Shintaku et al. | 324/248 |
| 5,058,431 | 10/1991 | Karwacki | 73/505 |
| 5,070,241 | 12/1991 | Jack | 250/336.1 |
| 5,075,283 | 12/1991 | De | 505/1 |
| 5,097,128 | 3/1992 | Jack | 250/336.2 |
| 5,114,912 | 5/1992 | Benz | 505/1 |
| 5,123,733 | 6/1992 | Divin | 356/121 |
| 5,128,316 | 7/1992 | Agostinelli et al. | 505/1 |

FOREIGN PATENT DOCUMENTS 0427640 5/1991 European Pat. Off.
WO91/06016 5/1991 PCT Int'l Appl.

OTHER PUBLICATIONS

Applied Physics Letters, vol. 55, No. 23, Dec. 4, 1989, pp. 2444-2446, Q. Hu, et al., "Design Analysis of a High $T_c$ Superconducting Microbolometer".

IEEE Transactions on Magnetics, vol. 25, No. 2, Mar. 1989, pp. 1313-1334, J. E. Sauvageau, et al., "Superconducting Kinetic Inductance Bolometer".

Solid State Technology, vol. 33, No. 4, Apr. 1990, pp. 187-191, S. A. Wolf, et al., "Visible and Infrared Detection Using Superconductors".

Nature, vol. 333, May 5, 1988, pp. 29-35, J. Clarke, "Small-Scale Analog Applications of High-Transition-Temperature Superconductors".

Physical Review B, vol. 39, No. 13, pp. 9712-9714, E. Zeldov, et al., "Nonbolometric Optical Response of $YBa_2Cu_3O_{7-\delta}$ Epitaxial Films", May 1989.

Journal of Applied Physics, vol. 66, No. 9, Nov. 1, 1989, pp. 4551-4554, J. C. Brasunas, et al., "Construction and Performance of a High-Temperature-Superconductor Composite Bolometer".

Primary Examiner—John B. Sotomayor
Attorney, Agent, or Firm—Oblon, Spivak, McClelland, Maier & Neustadt

[57] ABSTRACT

A tunable high-frequency device using a superconductive thin layer with a thickness smaller than the thickness of penetration of a magnetic field is positioned on a dielectric layer. Also included is a means for varying the density of the Cooper pairs of the superconductive thin layer.

12 Claims, 6 Drawing Sheets

TUNABLE HIGH-FREQUENCY DEVICES

BACKGROUND OF THE INVENTION

1. Field of the Invention

The invention relates to tunable high-frequency devices based on superconductive materials.

2. Discussion of Background

A device for the processing of electromagnetic waves may be formed by an element made of a superconductive material as well as a dielectric element associated with this superconductive element.

Since the thickness of an element made of superconductive material is smaller than the length of penetration $\lambda_L$ of the magnetic field, the device has an additional inductance, known as a kinetic inductance, due to the superconductive element, and this kinetic inductance gets added to the ordinary magnetic inductance.

This inductance takes account of the kinetic energy of the superconductive electrons. For very thin layers, it is proportional to the square of the depth of penetration $\lambda_L$ of the magnetic field and hence inversely proportional to the Cooper pairs density.

For a determined Cooper pairs density, the kinetic inductance is fixed.

The invention provides for means enabling the modification, at will, of the additional kinetic inductance. For this purpose, these means are such that they enable the modification of the Cooper pairs density.

This Cooper pairs density may be changed by:
the variation of the temperature;
the application of a polarization current;
the application of a magnetic field;
the illumination of the superconductor by a radiation.

SUMMARY OF THE INVENTION

The invention therefore relates to a tunable high-frequency device comprising at least one superconductive thin layer, with a thickness smaller than the length of penetration $\lambda_L$ of the magnetic field, deposited on a first dielectric layer, as well as means making it possible to cause variations in the density of the Cooper pairs of the superconductive thin layer.

BRIEF DESCRIPTION OF THE DRAWINGS

The different objects and features of the invention shall appear in the following description, given by way of an example, and in the appended drawings, of which.

DETAILED DESCRIPTION OF THE INVENTION

Figure 1:
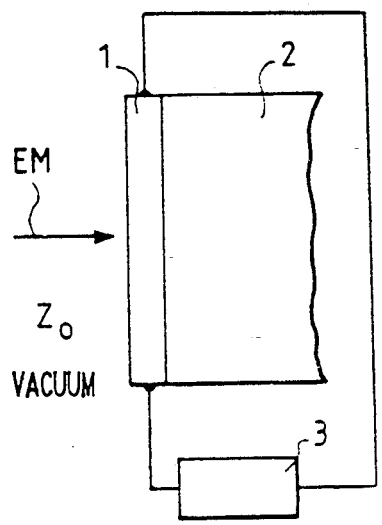
FIG. 1 shows an exemplary embodiment of a device according to the invention.
Figure 2:
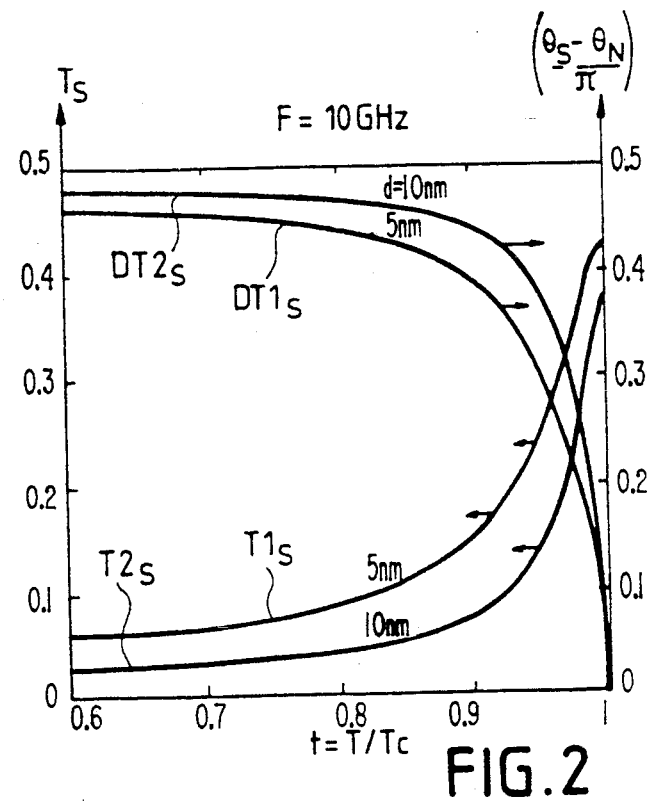
FIGS. 2 and 3 show curves of operation of the device of FIG. 1.

The simplified device of FIG. 1 has an element made of dielectric material 2 considered to have an infinite thickness having, on one face, a layer 1 of a superconductive material and receiving an electromagnetic wave EM. The thickness of the layer 1 is smaller than the depth of penetration of the magnetic field $\lambda_L$. Means 3 can be used to obtain a variation in Cooper pairs density, for example by the injection of a current I. But any other means enabling the Cooper pairs density to be modified may be suitable.

Figure 3:
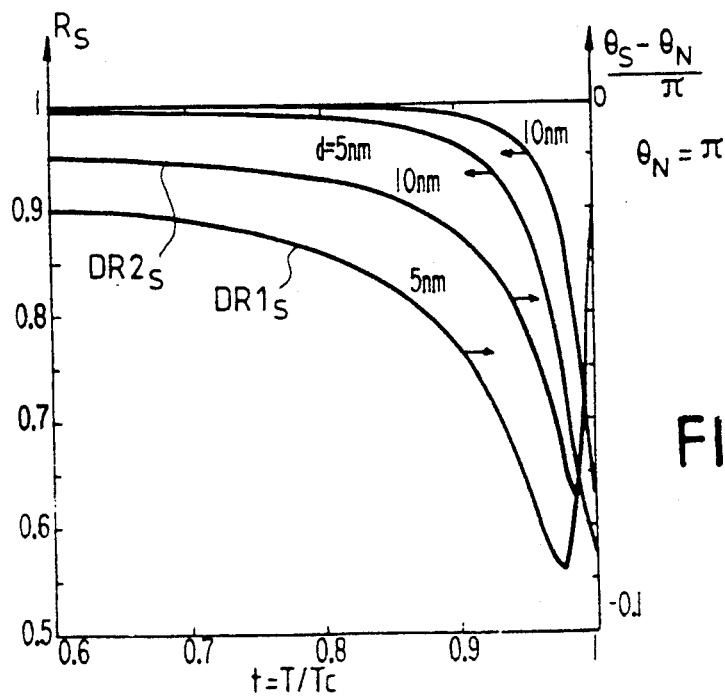

In a superconductive material, a rise in temperature induces a reduction in the Cooper pairs density and, hence, the penetration depth $\lambda_L$ increases. The coefficients of transmission and reflection of EM therefore depend on the temperature. All methods that can be used to vary the Cooper pairs density will have the same effects as the temperature. Theoretical results are shown hereinafter as a function of the reduced temperature t (ratio of the temperature of operation to the critical temperature). When t is equal to 1, the layer is in the normal state. The curves of FIG. 1 computed for 10 GHz by means of the two-fluid model show, as function of t, the coefficient of transmission $T_s$ and its phase-shift, divided by $\pi$ in relation to the phase-shift introduced by the layer in the normal state. The curve $T1_S$ represents the curve of the coefficient of transmission for a layer 1 thickness of 5 nm and the curve $T2_S$ represents the same type of curve for a layer 1 thickness of 10 nm. The curves $DT1_S$ and $DT2_S$ represent the phase-shifts introduced during the transmission for layer thicknesses of 5 nm and 10 nm respectively. FIG. 3 shows curves of variation of the reflection coefficient $R_S$ and the associated phase-shift divided by $\pi$ as for the transmission. FIG. 3 therefore shows coefficient of reflection curves $R1_S$ and $R2_S$ (for layer 1 thicknesses of 5 and 10 nm) and curves of phase-shift at reflection $DT1_S$ and $DT2_S$ (for these thicknesses of layers). The effects of the superconductive layer vary greatly for the reduced temperatures of more than than 0.8. In particular, the phase-shift at reflection has a maximum which may be greater than 10°.

Tunable absorbents may be made by using the variations in the coefficients of reflection and transmission of a very thin superconductive layer as a function of the Cooper pairs density.

Figure 4A:
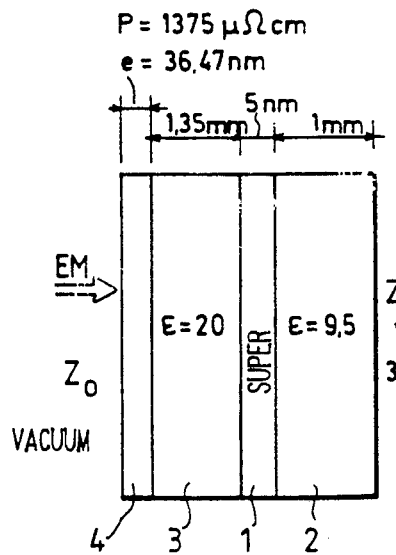
FIG. 4a shows a device according to the invention working as an absorbent.

FIG. 4a shows a multiple-layer screen having a layer 1 of superconductive material sandwiched between a layer 2 of dielectric and a layer 3 of dielectric. This layer 3 is covered with a very fine heat dissipation carbon layer 4 that receives an electromagnetic wave EM. There is a vacuum on either side of this structure.

Figure 5A:
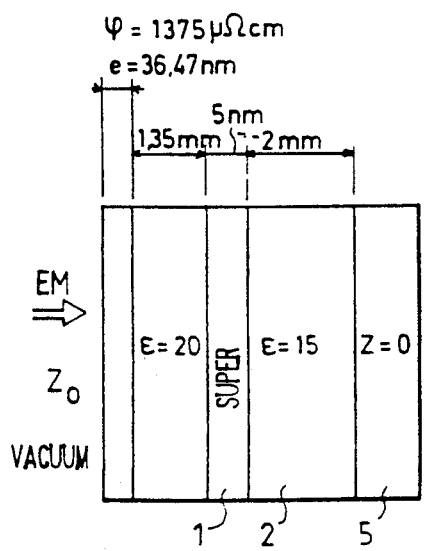
FIG. 5a shows a variant of the device of FIG. 4a and FIG. 5b shows curves of operation of this device.

The structure of FIG. 5a is similar to that of FIG. 4a but the dielectric layer 2 is covered with a thick conductive layer 5 with a wave impedance considered to be zero.

Figure 4B:
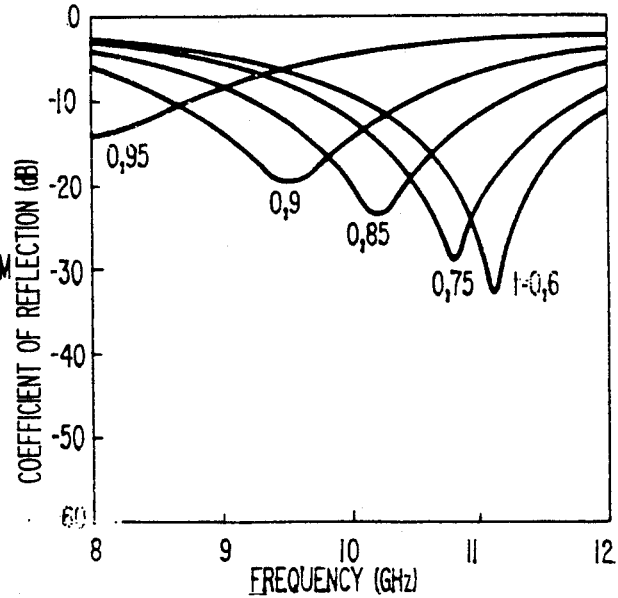
FIG. 4b shows curves of operation of this device.
Figure 5B:
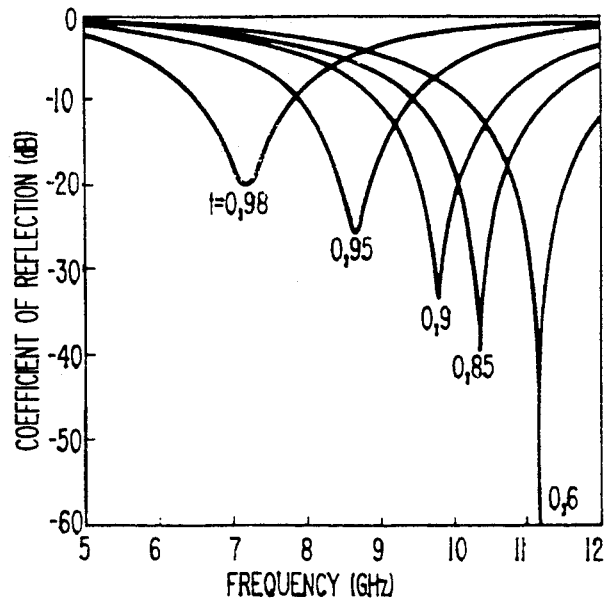

The first layer 4 crossed by the waves has a surface resistance of 377 ohms equal to the wave impedance of the vacuum. Since the structure of FIG. 4a is constituted by a screen placed in vacuum and that of FIG. 5a is applied to a highly conductive medium with zero wave impedance (metal), they have different coefficient of reflection curves (FIGS. 4b and 5b). Tuning ranges of several gigahertz may be obtained by varying the temperature of the superconductive layer or by other methods for varying the electron pair density.

Figure 6B:
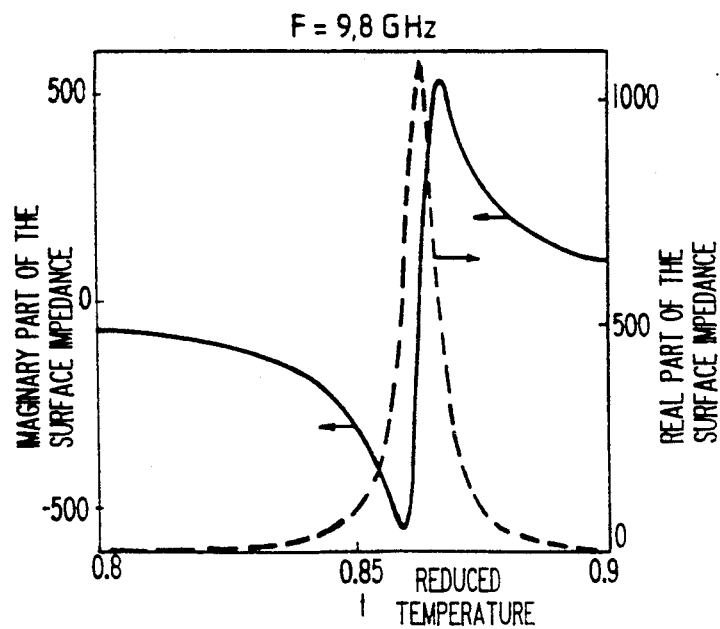
FIGS. 6a to 6d show a two-layer device for the phase-shifting, in reflection, of the electromagnetic waves, and its curves of operation.
Figure 6A:
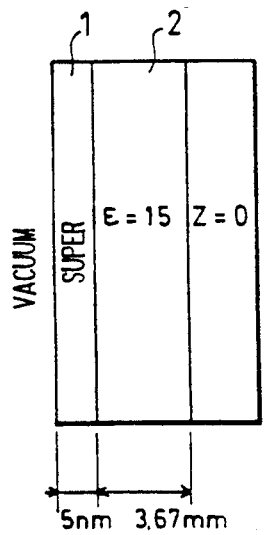

The kinetic inductance of a square with a side equal to unity of a superconductive layer having a thickness far smaller than the depth of penetration of the magnetic field $\lambda_L$ has, as the expression $L_S$:

$$L_S = \mu_o \lambda^2{}_L / d$$

where:
d = thickness of the superconductive layer
$\mu_o$ = permeability of the vacuum The surface inductance of a layer such as this is increased considerably by having a dielectric with negligible losses and with an appropriate thickness $e_1$ between the very thin superconductive layer 1 and a thick plate 5 of a highly conductive standard metal as shown in FIG. 6a. The thickness $e_1$ is in the neighborhood of a multiple of the half wavelength in the dielectric:

$$e_1 \sim k\lambda_o/2 \sqrt{\epsilon_1} - \lambda_L{}^2/d$$

where:
k is a positive whole number,
$\lambda_L$ is the depth of penetration in the magnetic field,
$\lambda_o$ is the wavelength in the vacuum,
$\epsilon_1$ is the relative permittivity of the dielectric.

Figure 6C:
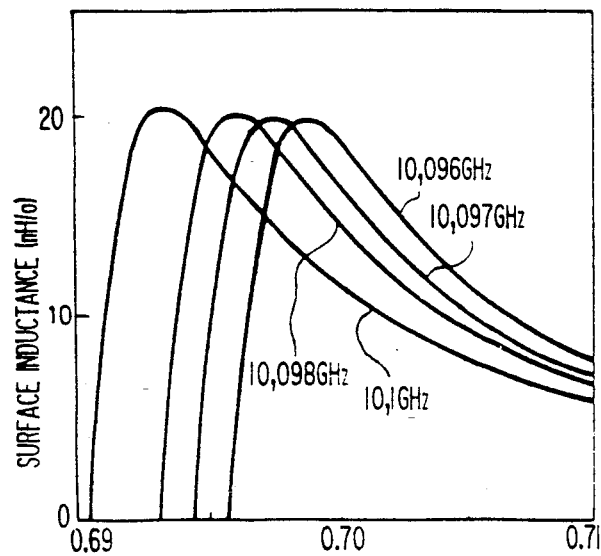

For example, for a layer of superconductor with a penetration depth of 800 rm at 0 K, with a superconductive layer thickness of 1 to 5 nm, the thickness 1 of the layer 2 should be 3.57 mm for a permittivity $\epsilon_1$ of 15. If the superconductor has a resistivity, in the normal state, of 300 $\mu$ $\Omega$.cm, the maximum gain in surface inductance at 10 GHz is 48 at the reduced temperature 0.786. These values have been computed by means of the two-fluid model. The value used (800 nm) for the penetration depth is in the neighborhood of that measured in one direction for the superconductors with high critical temperature such as, for example, Y Ba$_2$ Cu$_3$ O$_7$. The direction of the magnetic field is then parallel to the crystallographic axis a or b and the direction of penetration is parallel to b or a. As can be seen in FIGS. 6b and 6c, the surface inductance of the two-layer device of FIG. 6a depends greatly on the reduced temperature and varies very swiftly from a negative value (capacitance) to a positive value. Furthermore, the real part of the impedance shows a peak at the temperature corresponding to the zero value of the surface inductance (see FIG. 6b). It is a function of the values of the parameters of the superconductor.

The invention may be used as a narrow band electromagnetic wave absorbent since the surface impedance may be purely real and adjusted to 377 $\Omega$ for a value of the frequency, the depth of penetration and the resistivity of the superconductor before the transition.

Despite the increase in the surface resistance, this two-layer structure may also be advantageously used in various electronically controllable devices.

The invention may be applied to the making of radar polarimetrical signature scramblers.

A scrambler such as this uses the properties of the above-described two-layer structure and the high anisotropy of the superconductors with high critical temperature. Indeed, for example for a layer of Y Ba$_2$ Cu$_3$ O$_7$ with an optic axis c in the plane, the depth of penetration of the magnetic field, at 0 K, in the direction perpendicular to the layer depends on the direction of polarization of the magnetic field. It is in the neighborhood of 800 nm when the polarization is parallel to the axis a or b and in the neighborhood of 140 nm for a polarization parallel to the axis c.

Figure 6D:
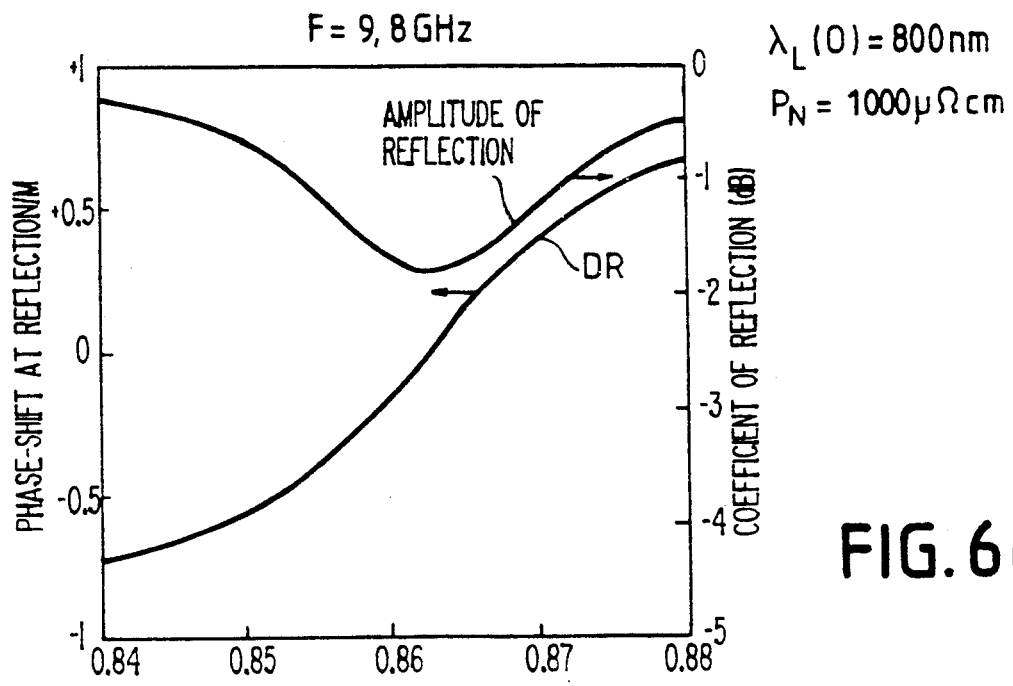

For the polarization corresponding to a penetration depth of 800 nm, the phase-shift at reflection on the two-layer varies from 0.7 n to 0.7 n for a reduced temperature varying from 0.84 to 0.88 (seen the curve DR in FIG. 6d), while, for the perpendicular polarization ($\lambda_L = 140$ nm) the phase-shift at reflection remains equal to $-\pi$. Hence, by adjusting the Cooper pairs density, it is possible to induce a deterioration, after reflection, of the polarization of a linearly polarized incident wave. It is possible to obtain a rotation of polarization, a circular polarization or an elliptical polarization. This device is inefficient if the incident polarization is parallel to the axis c. To avoid this drawback, it is possible to use devices with two reflections, of the dihedral type, formed by superconducting plates with perpendicular axes C (see FIG. 7). A modification after reflection may also be obtained if the incident polarization is circular and the direction of the polarization can be reversed.

Figure 8A:
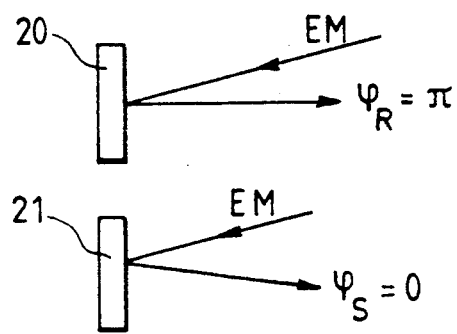
FIGS. 8a to 8c show a radar cross-section active reducing device.
Figure 8C:
Figure 8B:
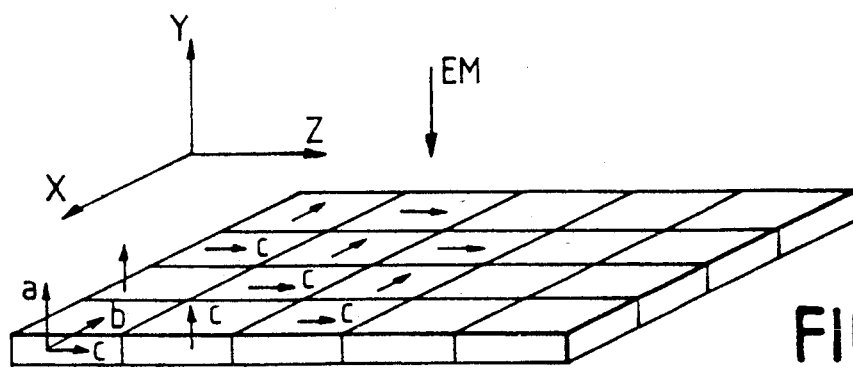

The invention may also be applied to the making of an active reducer of a radar cross-section around a frequency. As shown in FIGS. 8a to 8c, certain elements such as the element 20 are in the form of superconductive two-layer structures with a vertical axis c. Other elements such as the element 21 are made in the form of controllable superconductive two-layer structures with a horizontal axis C. For a determined frequency, the density of the Cooper pairs of the two-layer structures is adjusted to obtain a variation by $\pi$ in the phase-shift at reflection on 20 and 21 for both the components of the electromagnetic fields.

A plurality of devices, with crystallographic axes that are perpendicular, may be arranged side by side. For example, FIG. 8b shows a set of devices arranged along a plane XY. It must be noted, to simplifier the description, that the "skin" or "facing" of FIG. 8b is shown in a plane shape, but this is not obligatorily so. It may have a shape that is curved in space. Certain elements have their axis c parallel to the axis Y, and others have their axis c parallel to the axis X. The polarization of the incident magnetic field EM has any direction in the plane XY. Under these conditions, referring to FIG. 6d, the phase-shift at reflection between the adjacent elements may be adjusted to $\pi$ for the two components of the polarization. Furthermore, the devices are electronically controlled independently, thus making it possible to have reflections with a multitude of different phase-shifts, and to modify the radar signature at will.

Figure 7:
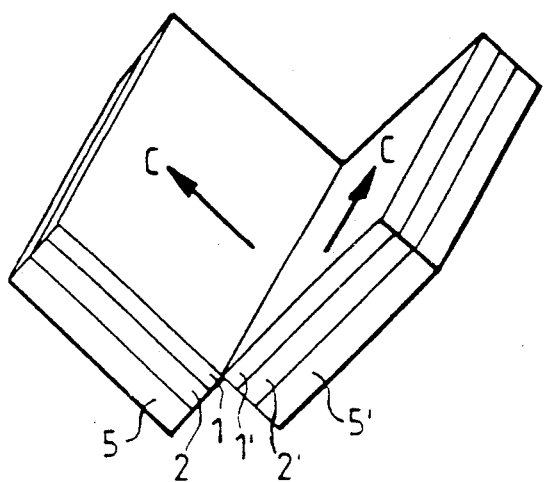
FIG. 7 shows an exemplary embodiment of a polarization scrambler.
Figure 9:
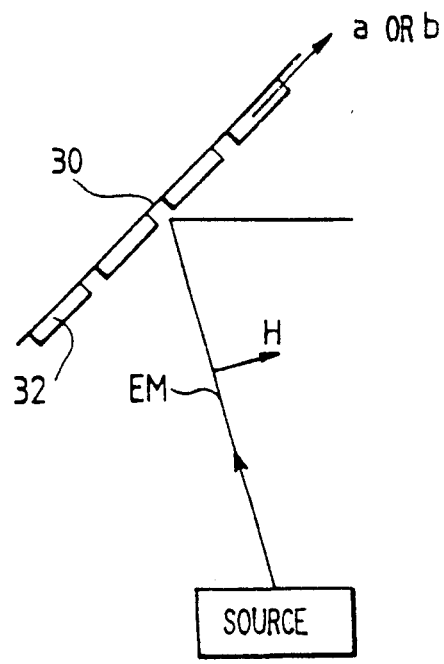
FIG. 9 shows an electromagnetic wave deflector applying the device of the invention.

The invention can also be applied to an electromagnetic wave deflector as shown in FIG. 9. It has a device 30 formed by an array of two-layer superconductive elements with dimensions smaller than the wavelength of the radiation emitted by the source. Each element of the device 30 reflects a part of the incident radiation in diffracting it. For a polarization of the magnetic field perpendicular to the axis c, the above-described methods can be used to control the phase at reflection of each element. Thus, it is possible to obtain an angular sweeping of the reflected beam by adjusting the phase of the reflected beams on each element. To work with a reflected beam having a variable direction of polarization, it is necessary to add on a polarization rotator in a near field. This may be done by reflecting the beam twice on the superconductive plates with perpendicular axes c as shown in FIG. 7.

At fixed frequency, the phase angle of the surface impedance of the two-layer structure varies swiftly (at an interval of about 0.03 at reduced temperature) between $-\pi/2$ and $\pi/2$ as a function of the Cooper pairs density. Phase-shifters in plane waveguide form (for example in microstrip form) may be made as shown in FIG. 10.

Figure 10:
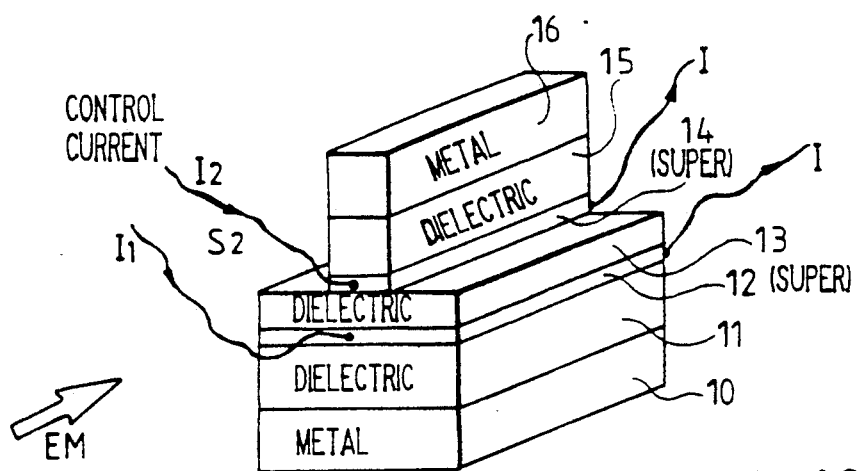
FIG. 10 shows a linear waveguide that can be used as a phase-shifter.

The device of FIG. 10 has a metal plate 10 covered with a dielectric plate 11 which is itself covered with a layer 12 of a superconductive material and a dielectric layer 13.

On the dielectric layer 13, there is deposited an element made of a superconductive material 14 having a linear shape on the layer 13. This element 14 is coated with a dielectric layer 15 and a metal layer 16. The element 14, the layer 15 and the layer 16 form the guiding element of the electromagnetic wave. For example, this device has a rectilinear shape but it could have any other shape. Electrical connections such as 17 and 18 make it possible to supply the superconductive layer 12 with a current I1 and the superconductive layer 14 with a current I2, thus enabling the device to be controlled electronically. The control of the surface impedances at S1 (the interface of the layers 12 and 13) and at S2 (the interface of the layer 13 and of the superconductive element 14) enable the phase-shift to be adjusted.

For a constant surface inductance and a variable Cooper pairs density, the frequency changes. It is therefore possible to make tunable resonators with this type of device.

Finally the invention can be applied to the making of bolometers. It is clear that the rise in temperature may be obtained by an incident radiation, and the two-layer phase-shifters may be used to measure an incident electromagnetic power. The measurement may be done on the phase-shift, for example by making an oscillator and by measuring its frequency.

It is clear that the description has been given purely by way of an example and that other alternative embodiments may be envisaged without going beyond the scope of the invention.

What is claimed is:

1. A tunable high-frequency device comprising:
   at least one superconductive thin layer, positioned on a first dielectric layer;
   means for applying a first magnetic field wherein the length of penetration $\lambda_L$ of said first magnetic field is less than the thickness of said superconductive thin layer;
   means for varying the density of Cooper pairs of said superconductive thin film layer wherein said means for making variations is independent of said first magnetic field and wherein said means for making variations is one of a means for applying a current for the polarization of said superconductive thin film, a means for applying a second magnetic field to said superconductive layer, and a means for applying an optic radiation to said superconductive thin layer.

2. A high-frequency wave absorbent device according to claim 1, comprising a second layer of a dielectric material covering the superconductive thin layer, a thin layer made of a relatively conductive material covering the second dielectric layer and receiving the wave to be absorbed, the thickness of the layer being taken as a function of the resistivity of the material that constitutes it in such a way that the surface impedance is substantially equal to the wave impedance of the ambient medium.

3. A microwave absorbent device according to claim 2, wherein the first dielectric layer is attached to a substrate with almost zero wave impedance.

4. A device according to claim 1 wherein a metal layer is attached to the first dielectric layer of the side opposite the thin superconductive layer and the thickness of the dielectric layer along the direction of propagation of a wave to be phase-shifted is substantially proportional to a multiple of half of the wavelength to be phase-shifted.

5. A device according to claim 1, wherein a metal layer is attached to the first layer of dielectric on the side opposite the superconductive thin layer, and wherein the thickness of the first dielectric layer is substantially given by the formula:

$$e_1 \sim k\lambda_o/2 \sqrt{\epsilon_1} - \lambda_L^2/d$$

where:
   $\lambda_o$ is the wavelength in the vacuum,
   $\epsilon_1$ is the relative permittivity of the dielectric,
   $\lambda_L$ is the depth of penetration in the magnetic field
   d is the thickness of the superconductive layer,
   k is a positive whole number, 6. An application of the device of claim 4 to an electromagnetic wave deflector comprising several devices positioned in a same plane.

7. An application of the device of claim 4 to an electromagnetic phase-shifter comprising:
   a plane-shaped element comprising a stack of a first metal layer, a first dielectric layer, a first superconductive layer and a second dielectric layer;
   an element located on the second dielectric layer having, on this second dielectric layer, the shape of a waveguide and comprising a stack of a second superconductive layer, a third dielectric layer and a second metal layer;
   electric connections connected to the first and second superconductive layers so as to separately supply these layers with currents enabling the modification, at will, of the density of the Cooper pairs of these layers.

8. An application of the device of claim 7 to a bolometer comprising an oscillator including a phase-shifter in its oscillation loop, wherein the measurement of an incident electromagnetic power at the phase-shifter is done by the measurement of the oscillation frequency.

9. An application of the device according to either of the claims 4 or 5 to a radar cross-section reduction facing, comprising a plurality of devices attached to one another, some of the devices having the optic axis c of the superconductive thin layer contained in the plane of the layer and parallel to the axis, and other devices having their axis c parallel to the axis perpendicular to the first axis.

10. A device according to claim 5, wherein the parameters of the device are adjusted to obtained a real reduced impedance of about 377 Ω for a wavelength $\lambda_o$ having a value of about $$(e_1 + \lambda_L^2/d)2 \sqrt{\epsilon_1}/k.$$

11. An application of the device of claim 5 to a polarization scrambler comprising at least two devices a double (dihedral) reflection, the axes c of which are perpendicular, thus enabling the polarization of the reflected wave to be controlled.

12. An electromagnetic wave deflector including a plurality of high frequency devices in the same plane, each of said high frequency devices comprising:

a superconductive thin layer having a thickness smaller than the length of penetration $\lambda_L$ of a first magnetic field, said superconductive thin layer being positioned on a first dielectric layer;

means independent of said first magnetic field for varying the density of Cooper pairs of said superconductive thin layer; and a metal layer attached to said first dielectric layer on a side of said first dielectric layer which is opposite said thin superconductive layer wherein the thickness of the dielectric layer along the direction of propagation of a wave to be phase-shifted is substantially proportional to a multiple of half of the wavelength to be phase-shifted.

* * * * *